(12) United States Patent
Chen et al.

(10) Patent No.: US 9,305,992 B2
(45) Date of Patent: Apr. 5, 2016

(54) INTEGRATED CIRCUIT INDUCTORS WITH INTERTWINED CONDUCTORS

(75) Inventors: Shuxian Chen, Fremont, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 599 days.

(21) Appl. No.: 13/161,893

(22) Filed: Jun. 16, 2011

(65) Prior Publication Data

US 2012/0319236 A1    Dec. 20, 2012

(51) Int. Cl.
| | | |
|---|---|---|
| *H01L 49/02* | (2006.01) | |
| *H01L 23/522* | (2006.01) | |
| *H01F 17/00* | (2006.01) | |

(52) U.S. Cl.
CPC ............ *H01L 28/10* (2013.01); *H01F 17/0013* (2013.01); *H01L 23/5227* (2013.01); *H01F 2017/0046* (2013.01); *H01F 2017/0073* (2013.01); *H01L 2924/0002* (2013.01)

(58) Field of Classification Search
CPC ............ H01L 28/10; H01L 2924/0002; H01L 23/5227; H01L 2924/00; H01F 17/0006; H01F 17/0013; H01F 2017/002; H01F 2017/0046; H01F 2017/0073
USPC .......... 257/531, E21.022, 528, 277; 336/200, 336/188, 170
See application file for complete search history.

(56) References Cited

U.S. PATENT DOCUMENTS

| | | | |
|---|---|---|---|
| 4,532,484 A | 7/1985 | Tajima et al. | |
| 4,626,816 A | 12/1986 | Blumkin et al. | |
| 5,262,740 A | 11/1993 | Willems | |
| 5,281,929 A | 1/1994 | Willems | |
| 5,610,433 A | 3/1997 | Merrill et al. | |
| 6,611,181 B2 | 8/2003 | Marketkar et al. | |
| 6,798,039 B1 * | 9/2004 | Gillespie et al. | 257/531 |
| 6,798,326 B2 * | 9/2004 | Iida | 336/200 |
| 7,135,951 B1 | 11/2006 | Sidhu | |
| 7,380,328 B2 * | 6/2008 | Ahn et al. | 29/602.1 |

(Continued)

FOREIGN PATENT DOCUMENTS

| | | | | |
|---|---|---|---|---|
| DE | 10132847 | * | 1/2003 | ............. H01F 27/28 |
| FI | WO 98/43258 | * | 10/1998 | ............. H01F 27/28 |

OTHER PUBLICATIONS

Cheung et al., "Shielded Passive Devices for Silicon-Based Monolithic Microwave and Millimeter-Wave Integrated Circuits," pp. 1183-1200, IEEE Journal of Solid-State Circuits, vol. 41, No. 5, May 2006.

(Continued)

*Primary Examiner* — Galina Yushina
(74) *Attorney, Agent, or Firm* — Treyz Law Group; G. Victor Treyz; Vineet Dixit (57) ABSTRACT

An inductor may be formed from a conductive path that includes intertwined conductive lines. There may be two, three, or more than three intertwined conductive lines in the conductive path. The conductive lines may be formed from conductive structures in the dielectric stack of an integrated circuit. The dielectric stack may include metal layers that include conductive traces and may include via layers that include vias for interconnecting the traces. The intertwined conductive lines may be formed from the conductive structures in the metal and via layers. In crossover regions, the conductive lines may cross each other without electrically connecting to each other. Vias may be used to couple multiple layers of traces together to reduce line resistance.

23 Claims, 10 Drawing Sheets

(56) References Cited

U.S. PATENT DOCUMENTS

| | | |
|---|---|---|
| 2003/0030532 A1 | 2/2003 | Iida |
| 2003/0229982 A1 | 12/2003 | Vilander et al. |
| 2003/0234437 A1* | 12/2003 | Yamamoto et al. ............ 257/531 |
| 2004/0075521 A1* | 4/2004 | Yu et al. ........................ 336/200 |
| 2004/0103522 A1 | 6/2004 | Ahn et al. |
| 2006/0202338 A1 | 9/2006 | Strasser |
| 2008/0186123 A1* | 8/2008 | Wei et al. ...................... 336/200 |
| 2009/0027150 A1* | 1/2009 | Gianesello .................... 336/200 |
| 2009/0261452 A1* | 10/2009 | Tsujimoto et al. ............ 257/531 |
| 2011/0140797 A1* | 6/2011 | Lee ................................ 331/167 |

OTHER PUBLICATIONS

Yu et al., "A 22-24 GHz 4-Element CMOS Phased Array With On-Chip Coupling Characterization," pp. 2134-2143, IEEE Journal of Solid-State Circuits, vol. 43, No. 9, Sep. 2008.

Watt et al., U.S. Appl. No. 13/078,701, filed Apr. 1, 2011.

Geen et al., "Miniature Multilayer Spiral Inductors for GaAs MMICs," GaAs IC Symposium, 1989.

Watt et al., U.S. Appl. No. 12/363,545, filed Jan. 30, 2009.

Chen et al., U.S. Appl. No. 12/623,161, filed Nov. 20, 2009.

* cited by examiner

FIG. 1

(PRIOR ART)

FIG. 2

(PRIOR ART)

INTEGRATED CIRCUIT INDUCTORS WITH INTERTWINED CONDUCTORS

BACKGROUND

This relates to integrated circuits, and more particularly, to integrated circuit inductors.

It is often necessary to form inductors on integrated circuits. Inductors may be used, for example, to form oscillators, filters, and other circuits.

At relatively low frequencies, integrated circuit inductors may be formed from solid metal traces. The solid metal traces may be arranged in straight lines or in spiral inductor shapes. Although performance may be satisfactory in some situations, operation at high frequencies poses challenges due to the skin effect and proximity effect. These challenges may make it difficult or impossible to form an inductor from a solid metal trace that performs satisfactorily. Challenges are also posed by the ongoing need to shrink device geometries. As semiconductor processing technologies progress, the maximum line widths permitted by semiconductor fabrication design rules tend to decrease, which tends to increase the minimum resistance of the metal lines on a device. This can adversely affect integrated circuit inductor performance.

SUMMARY

Inductors may be formed from conductive paths that include intertwined conductive lines. The conductive lines may be formed in a dielectric stack. A dielectric stack may be formed from alternating metal layers and via layers on an integrated circuit. The metal layers include patterned lines. The via layers include vias that interconnect the patterned lines from adjacent metal layers. The conductive lines may be formed from patterned metal layer lines and vias.

The intertwined conductive lines may run parallel to one another along the length of the conductive path. In crossover regions, the intertwined conductive lines may cross over each other without electrically connecting to each other.

Vias in the via layers of the dielectric stack may be used to connect traces in the intertwined conductive lines to parallel traces in other metal layers, thereby decreasing line resistance. Vias may also be used to connect a trace in one metal layer to a crossover segment in another layer.

A conductive path may have a linear shape that extends in a straight line between a pair of inductor terminals or may have a loop shape.

Further features of the invention, its nature and various advantages will be more apparent from the accompanying drawings and the following detailed description of the preferred embodiments.

DETAILED DESCRIPTION

Figure 1:
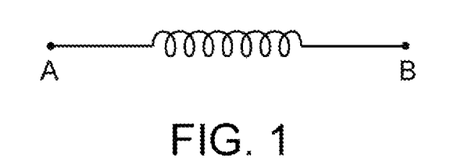
FIG. 1 is a circuit diagram of an inductor in accordance with an embodiment of the present invention.

Inductors are commonly provided on integrated circuits for use in forming filters, oscillators, and other circuitry on the integrated circuit. As shown in FIG. 1, an integrated circuit inductor may have a first terminal A and a second terminal B. In a circuit, terminals A and B may be connected to transistors, resistors, capacitors, and other circuitry.

Figure 2:
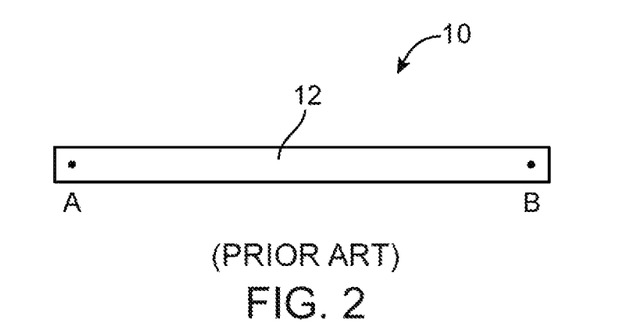
FIG. 2 is a top view of a conventional linear inductor formed from a solid strip of metal on an integrated circuit.
Figure 3:
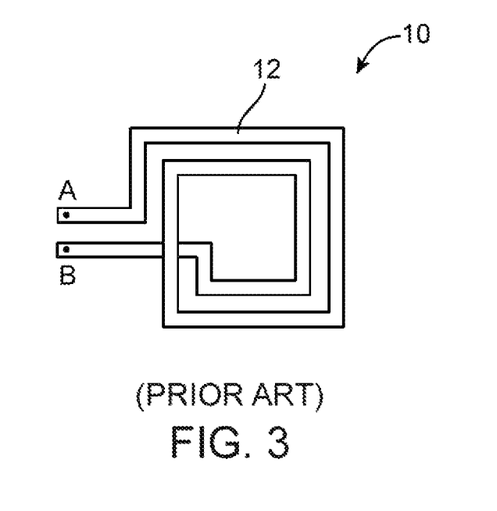
FIG. 3 is a top view of a conventional spiral inductor from a solid strip of metal on an integrated circuit.

Inductors are commonly formed from solid strips of metal (i.e., solid metal traces in the dielectric stack of an integrated circuit). FIG. 2 is a top view of a conventional linear inductor formed from a straight solid strip of metal (e.g., a solid metal trace). FIG. 3 is a top view of a conventional linear inductor formed from a solid strip of metal in a spiral pattern.

The quality of an inductor can be quantified by its Q (quality) factor. The Q factor for an inductor is proportional to the ratio of the inductance L of the inductor to the resistance R of the inductor (as measured between terminals A and B). It is therefore desirable to minimize the resistance R to maximize Q.

Figure 4:
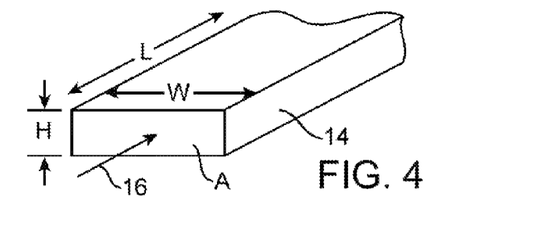
FIG. 4 is a perspective view of a strip of conductor having a cross-sectional area that affects its resistance.

One way to lower the resistance of an inductor involves increasing the width of the metal trace that is used in forming the inductor. As shown in FIG. 4, metal trace 14 may be characterized by a width W, a height H and a length L. During operation, current I flows along longitudinal dimension L of trace 14. The cross-sectional area A (equal to height H times width W) of trace 14 is inversely proportional to the resistance R of trace 14. For a given semiconductor fabrication process and trace thickness (i.e., a given height H) and for a given trace length L, the resistance R is inversely proportional to the value of width W. Larger values of W will result in corresponding decreases in the value of R.

There is generally a practical limit, however, to the extent to which the metal trace width W can be increased. This is because commercially practical semiconductor fabrication processes have design rules that limit trace widths.

Another factor that impacts resistance R is the skin effect. At high frequencies, signals propagate only in the outermost surface of a conductive trace, as illustrated by surface region 16 in the cross-sectional view of conductor 14 in FIG. 5. Because less cross-sectional area is involved in conducting current, the resistance of conductor 14 increases.

Figure 5:
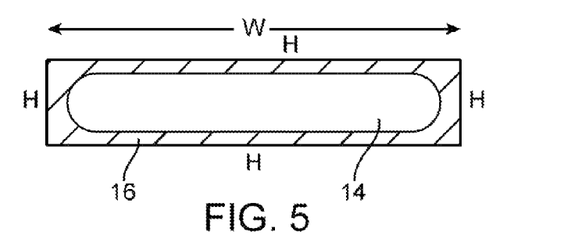
FIG. 5 is a cross-sectional view of a conductor in which the skin effect has an impact on the effective resistance of the conductor when operating at high frequencies.

The depth of the surface layer in which the signals in conductor 14 propagate (i.e., the skin depth for conductor 14) is a function of the frequency of the signals. At low frequencies, the skin effect is negligible, the skin depth is large compared to the dimensions of conductor 14, and current flows evenly throughout the bulk of conductor 14. At high frequencies (e.g., at frequencies from about 3 GHz to 50 GHz or more), the skin depth can be smaller than the lateral dimensions of conductor 14 and the skin effect can therefore have a significant impact on resistance. The increase in resistance due to the skin effect at high frequencies can adversely affect the Q value of an inductor formed using the conductor.

Figure 6:
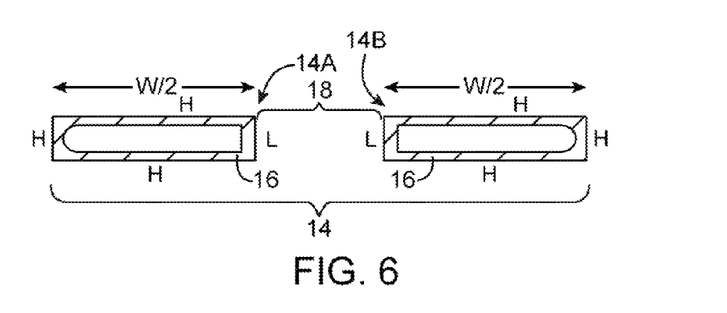
FIG. 6 is a cross-sectional side view of a conductive path formed from a pair of parallel conductors in which the skin effect and proximity effects have an impact on the resistance of the conductive path.

In an effort to overcome design rule limitations on maximum trace widths and to minimize the increase in resistance that tends to arise due to the skin effect when operating inductors at high frequencies, conventional inductors sometimes include longitudinal slots. These slots separate the traces into multiple parallel traces, each of which is narrower than the maximum trace width specified by the semiconductor fabrication design rules. FIG. 6 is a cross-sectional view of a conductor such as conductor 14 of FIG. 5 that has been divided into two traces (14A and 14B) of equal width in this way.

As shown in FIG. 6, there may be more surface area available for current 16 to flow through traces 14A and 14B than with trace 14A, even when the total width W (W/2 for trace 14A plus W/2 for trace 14B) is maintained constant. This tends to reduce resistance R. The reduction in R that is achieved due to the division of conductor 14 of FIG. 5 into parallel conductors 14A and 14B by introduction of slot 18 is, however, limited by electromagnetic field proximity effects.

Proximity effects cause separate traces 14A and 14B to function as a single conductor that is subject to the skin effect. As shown in FIG. 6, surface portions of traces 14A that are not immediately adjacent to trace 14B (i.e., the upper, left, and lower surfaces of trace 14A) are able to a higher level (H) of current than the surface of trace 14A that is immediately adjacent to trace 14B (i.e., the right surface of trace 14A, which carries only low current L). Likewise, the upper, right, and lower surfaces of trace 14B can carry high current amounts H, whereas the left surface of trace 14B can carry only low current amounts L. Because current L is less than current H due to proximity effects, the expected decrease in resistance R from dividing conductor 14 into multiple parallel traces with slot 18 is not fully achieved.

Figure 7:
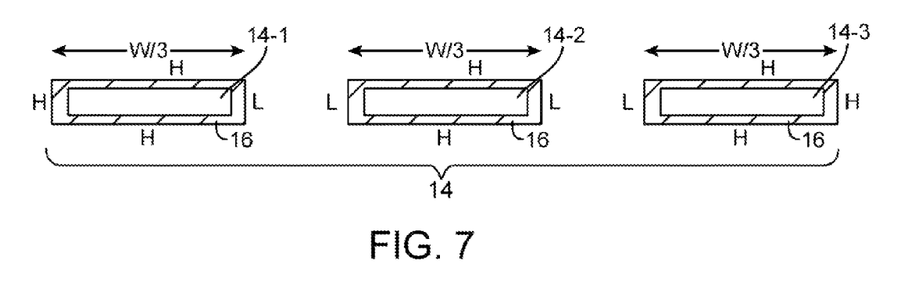
FIG. 7 is a cross-sectional side view of a conductive path formed from three parallel conductors in which the skin effect and proximity effects have an impact on the resistance of the conductive path.

As shown in FIG. 7, proximity effects can likewise reduce the benefit of forming slots 18 in an arrangement in which there are multiple slots 18 (e.g., when conductor 14 is formed from three parallel traces 14-1, 14-2, and 14-3).

To reduce the impact of proximity effects and thereby enhance inductor performance at high operating frequencies, an inductor may be formed from a conductive path that includes multiple intertwined conductive lines. The conductive path may include a pair of intertwined conductive lines, three intertwined conductive lines, four intertwined conductive lines, or more than four intertwined conductive lines. The conductive lines may be formed from traces in a dielectric stack on an integrated circuit. Traces from more than one metal layer of the dielectric stack may be used. Vias in interposed via layers may be used to interconnect traces in adjacent metal layers.

Figure 8:
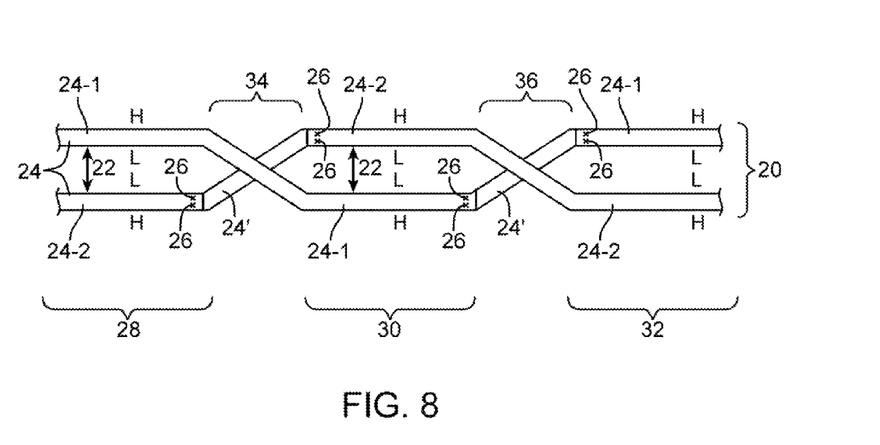
FIG. 8 is a top view of a conductive path that has been formed from a pair of parallel intertwined conductors that repeatedly cross over one another and that may be used in forming an inductor in accordance with an embodiment of the present invention.

FIG. 8 is a top view of an illustrative inductor conductive path 20 that has been formed from a pair of intertwined parallel conductive lines 24. As shown in FIG. 8, conductive path 20 (sometimes referred to as a conductor or conductive line) may include a pair of intertwined conductive lines 24-1 and 24-2. Conductive lines 24-1 and 24-2 (sometimes referred to as conductors or conductive paths) may be formed from traces in layers of a dielectric stack on an integrated circuit. For example, conductive lines 24 may include traces in the Nth metal layer of a dielectric stack and traces in the N-1 metal layer of the stack. The traces in the N-1 metal layer of the stack may, for example, be used in forming pass-under segments such as segment 24'. Vias 26 may be used to interconnect traces in the Nth and N-1 layers.

With this type of configuration, conductive lines 24-1 and 24-2 twist around each other in a corkscrew fashion and repeatedly cross over one another. There may be any suitable number of segments in conductive path 24 between a pair of respective inductor terminals A and B (e.g., two or more, three or more, four or more, five or more, ten or more, twenty of more, one hundred or more, etc.). In the example of FIG. 8, there are three segments (segments 28, 30, and 32) and two associated crossover regions 34 and 36. In crossover region 34, line 24-2 uses segment 24' to pass under line 24-1. In cross-over region 36, line 24-1 contains a segment 24' that passes under line 24-2. This pattern repeats along conductive path 24, so that lines 24-1 and 24-2 repeatedly cross over one another.

Because of the intertwined nature of conductive lines 24-1 and 24-2, the influence of proximity effects is reduced and the resistance R of conductive path 24 is reduced. This is illustrated by the labels "L" and "H" adjacent to the edges of the conductive lines in FIG. 8. In segment 28, the outer edges of lines 24-1 and 24-2 are labeled "H" to indicate that these portion of lines 24-1 and 24-2 are least influenced by proximity effects and are able to carry the largest amount of current (i.e., the depth associated with the skin effect in these portions of the lines is relatively large). The inner edges of lines 24-1 and 24-2 oppose one another across gap 22 (e.g., a gap filed with a dielectric such as silicon oxide in the dielectric stack). The inner edges of lines 24-1 and 24-2 are labeled "L" to indicate how these portions of lines 24-1 and 24-2 are adversely affected by proximity effects and are able to carry less current than the "H" portions of the lines (i.e., the depth associated with the skin effect is relatively shallow).

In successive segment 30 of conductive path 24, the "H" and "L" assignments are reversed, due to the presence of crossover region 34. In particular, the inner "L" edge of line 24-2 in segment 28 has become the outer "H" edge of line 24-2 in segment 30. Likewise, the inner "L" edge of line 24-1 in segment 28 has become the outer "H" edge of line 24-1 in segment 30. This scrambling process is repeated in subsequent segments such as segment 32 and decreases the influence of the proximity effect in conductive path 24. The volume of conductor in the traces in path 24 that can carry high frequency currents is therefore increased and resistance R is decreased.

Figure 9:
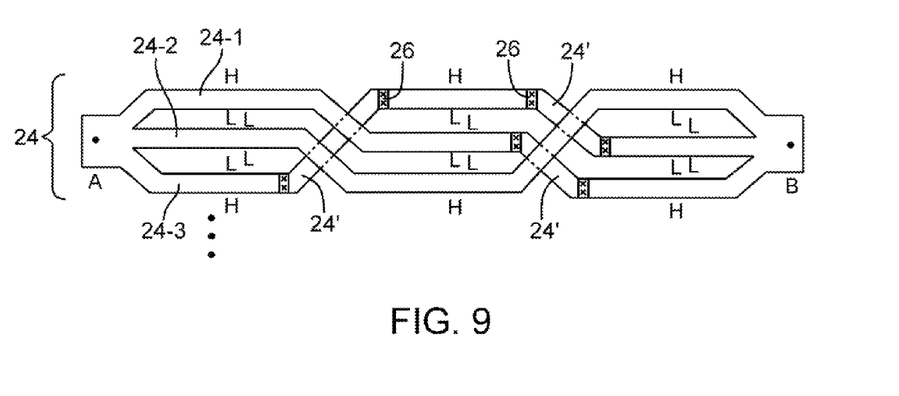
FIG. 9 is a conductive path that has been formed from a set of three parallel intertwined conductors that repeatedly cross over one another and that may be used in forming an inductor in accordance with an embodiment of the present invention.

FIG. 9 is a top view of a three-line conductive path. As shown in FIG. 9, conductive path 24 of FIG. 9 includes conductive lines 24-1, 24-2, and 24-3. Crossover segments 24' may be used to allow lines 24-1, 24-2, and 24-3 to cross over and under one another without becoming shorted. Vias 26 may be used to interconnect trace segments in different interconnect layers in the dielectric stack. The labels "H" and "L" in FIG. 9 shows how the three-conductor intertwining arrangement of FIG. 9 scrambles the portions of the traces that are subject to proximity effects and therefore decreases R for conductive path 24.

Figure 10:
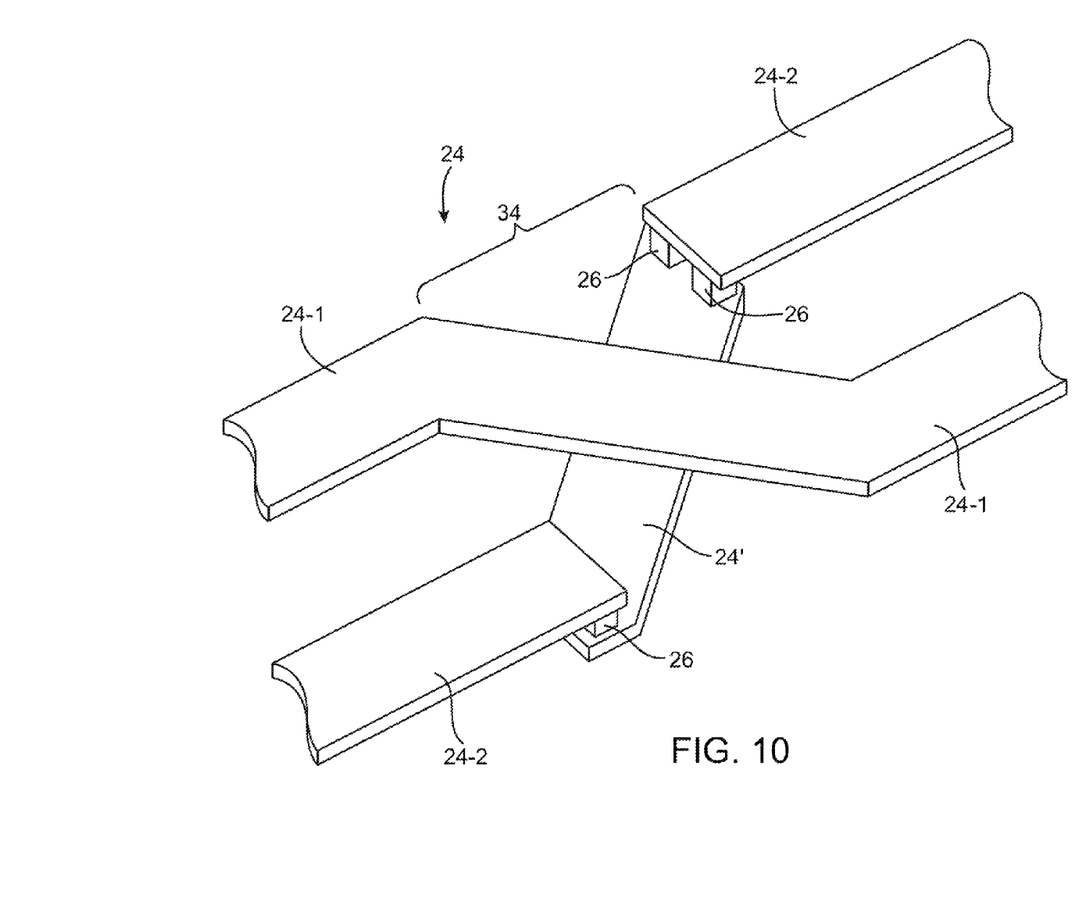
FIG. 10 is a perspective view of a conductive path that has intertwined conductors that have been formed from conductive traces in multiple layers of a dielectric stack on an integrated circuit in accordance with an embodiment of the present invention.

FIG. 10 is a perspective view of conductive path 24 showing how conductive lines 24-1 and 24-2 may be formed from traces in different metal layers in a dielectric stack on an integrated circuit. (The dielectric that is normally interposed between the metal layers in the dielectric stack is not shown in FIG. 10). As shown in FIG. 10, line 24-1 may be formed from metal traces in an upper layer of the dielectric stack (e.g., the Nth metal layer). Line 24-2 may also be formed from metal traces in an upper metal layer of the dielectric stack. To allow lines 24-1 and 24-2 to cross one another without becoming electrically shorted to each other, line 24-2 may include segment 24' in crossover region 34. Segment 24' may be formed in a lower metal layer in the dielectric stack (e.g., the N-1 metal layer in the stack). Segment 24' may be connected to the upper layer trace for line 24-2 using vias 26. This type of crossover arrangement may be used in conductive paths such as path 24 of FIG. 9 that include three or more intertwined conductive lines. The example of FIG. 10 in which conductive path 24 has two intertwined conductive lines is merely illustrative.

Figure 11:
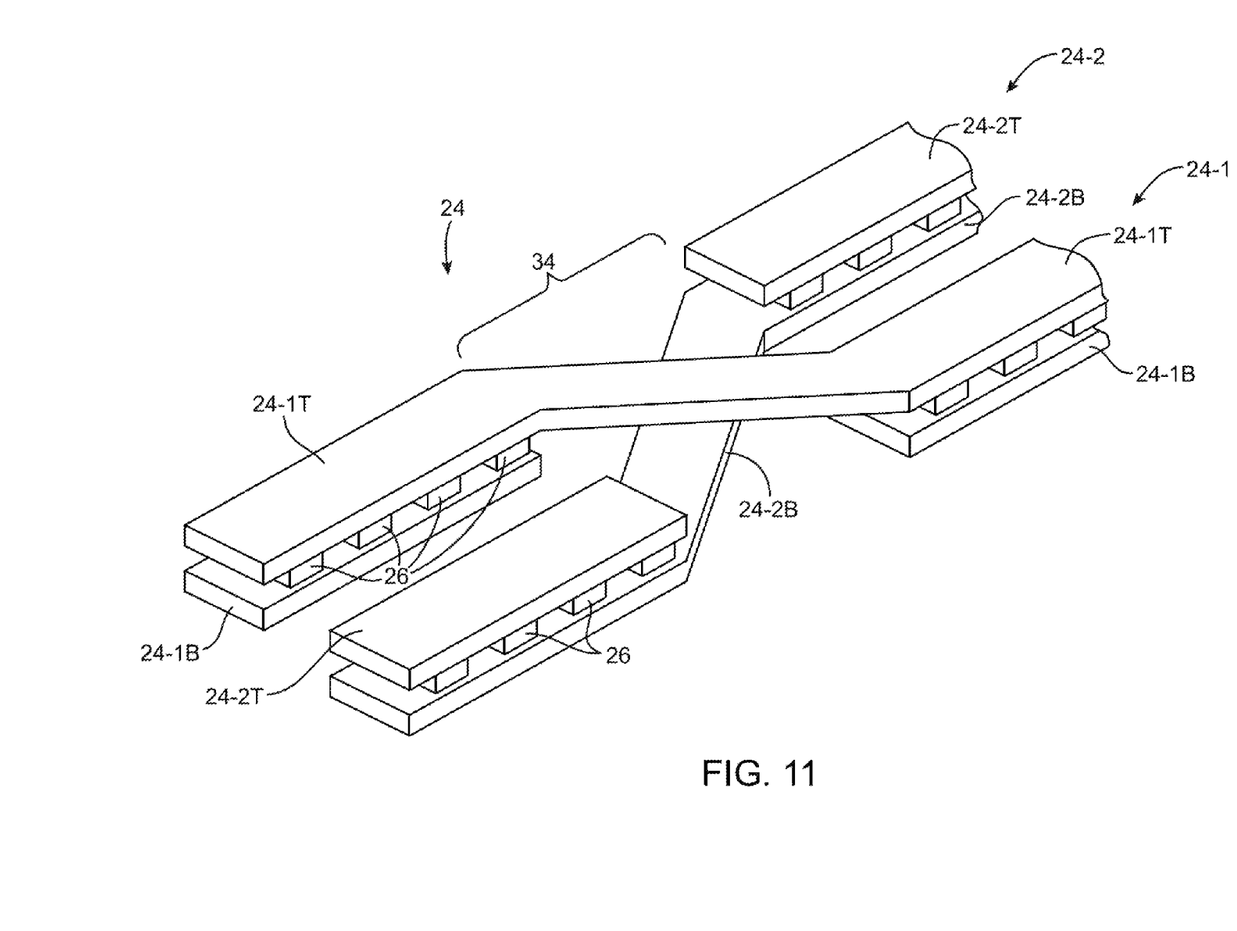
FIG. 11 is a perspective view of a conductive path that has a pair of intertwined conductors that have been formed from parallel traces in multiple layers of a dielectric stack that are shorted together using interposed vias in accordance with an embodiment of the present invention.

If desired, metal traces from different metal layers in the dielectric stack may be connected in parallel to reduce line resistance. An example of this type of arrangement in a configuration where conductive path 24 has two conductive lines 24-1 and 24-2 is shown in FIG. 11. As shown in FIG. 11, conductive line 24-1 includes upper trace 24-1T and lower trace 24-1B. Traces 24-1T and 24-1B are connected in parallel by a series of vias 26 along the length of line 24-1. Line 24-2 is likewise formed from upper metal trace 24-2T and lower metal trace 24-2B that are shorted together using vias.

By connecting metal traces from multiple metal layers in parallel using vias 26, the resistance of each conductive line may be reduced and the overall resistance of conductive path 24 may be reduced. In crossover region 34, the traces may be configured to form crossover paths. For example, trace 24-1B may have a gap through which trace 24-2B may pass and trace 24-2T may have a gap through which trace 24-1T may pass. The gaps allow the conductive lines 24-1 and 24-2 to cross one another without being electrically connected in the crossover region. Although illustrated using a two-line configuration in the FIG. 11 example, conductive paths 24 with three or more intertwined conductors such as path 24 of FIG. 9 may also be provided with conductive lines that are formed by shorting traces from multiple metal layers together in parallel, if desired.

Figure 12:
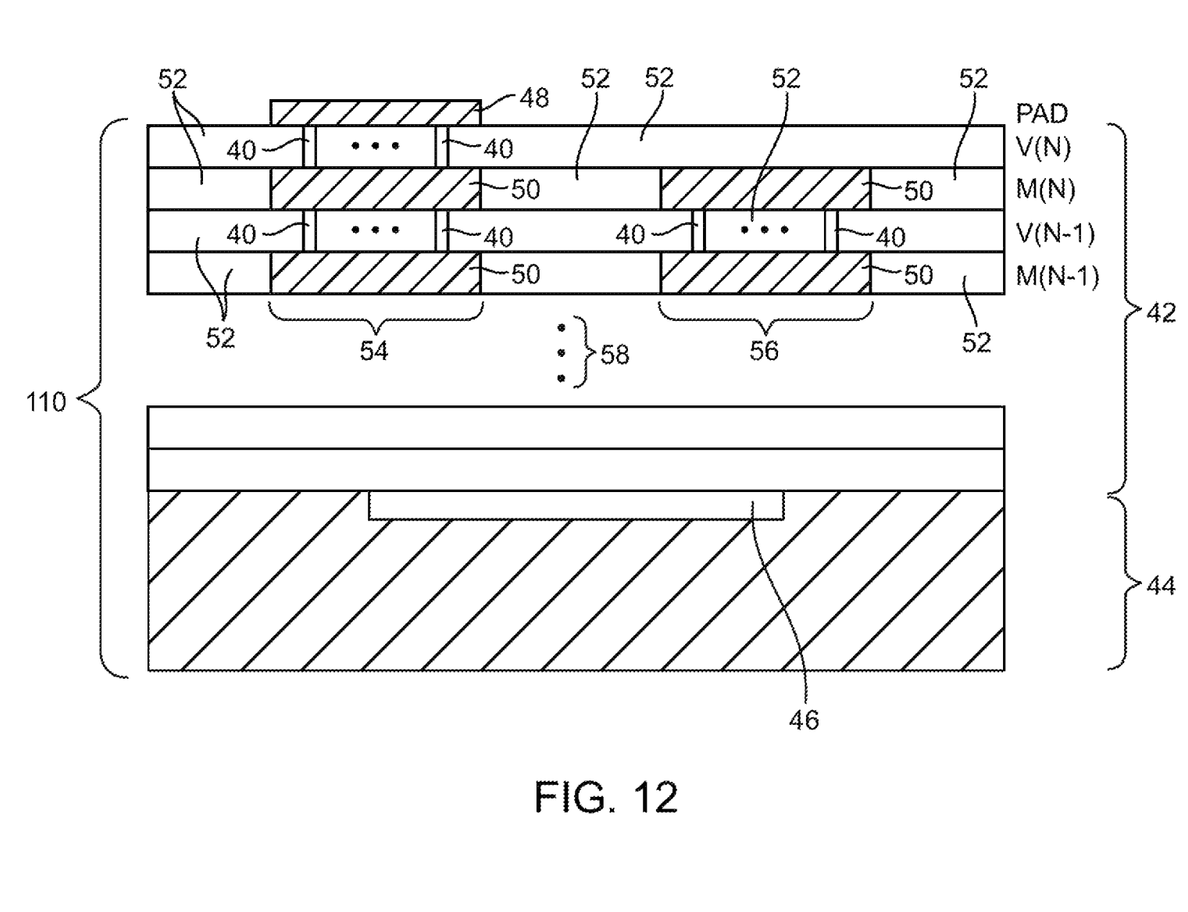
FIG. 12 is a cross-sectional side view of a dielectric stack of the type that may contain patterned metal traces for forming conductive inductor paths having multiple intertwined conductors in accordance with an embodiment of the present invention.

FIG. 12 is a cross-sectional side view of a dielectric stack on an integrated circuit. The metal layers and via layers of FIG. 12 may be used in forming conductive paths such as paths 24 with two, three, or more than three intertwined conductive lines.

As shown in FIG. 12, integrated circuit 110 may include circuitry 46. Circuitry 46 may be formed within integrated circuit substrate 44. Circuitry 46 may include, for example, metal-oxide-semiconductor transistors and other circuit elements. Substrate 44 may be formed from a semiconductor such as silicon (e.g., substrate 44 may be part of a silicon wafer).

Dielectric stack 42 may be formed on the surface of substrate 44. Dielectric stack may include layers such as metal layers M(N), M(N-1), M(N-2), etc., and interposed via layers V(N), V(N-1), V(N-2), etc. The uppermost layer of stack 42 (PAD) may sometimes be used in forming input-output pads and may therefore sometimes be referred to as the pad layer of dielectric stack 42.

Each of the layers of dielectric stack 42 is typically formed primarily from an insulator such as silicon dioxide or other dielectric 52. Metal layers M may contain patterned metal structures such as metal lines 50 that are separated from each other by regions of dielectric 52. Via layers V may contain conductive vias 40 that are separated by regions of dielectric 52. Pad layer PAD may include conductive structures such as structure 48 (e.g., part of an input-output pad, part of a conductive line, etc.). Metal lines 50 (which may serve as lines 24-1, 24-2, and 24-3 in conductive path 24) may be formed from metals such as copper. Structures in pad layer PAD may be formed from metals such as aluminum. Vias 40 (which may serve as vias 26 in conductive path 24) may be formed from tungsten or other metals. Other metals and conductive materials may also be used for forming metal structures 50, vias 40, and pad-layer structures 48, if desired.

As shown by illustrative structure 54, multiple metal layer structures 50 and a pad structure 48 may be electrically connected to each other using layers of interposed vias 40. As shown by illustrative structure 56, pad layer structures 48 may, if desired, be omitted. There may be any suitable number of metal layers M in structures such as structures 54 and 56, as indicated by dots 58.

The layers of stack 42 may be used in forming conductive paths 24 for inductors on integrated circuit 110. For example, conductive lines 24 may be formed from metal traces 50 in metal layers M(N), M(N-1), etc. In particular, traces 24-1T and 24-2T may be formed from metal lines 50 in layer M(N) and traces 24-1B and 24-2B may be formed from metal lines in layer M(N-1) and these traces may be interconnected by vias 40 (i.e., vias 40 of dielectric stack 42 of FIG. 12 may serve as vias 26 in conductive path 24). If desired, traces from additional metal layers such as layer M(N-2) may be connected in parallel with the other traces to further reduce resistance.

Figure 13:
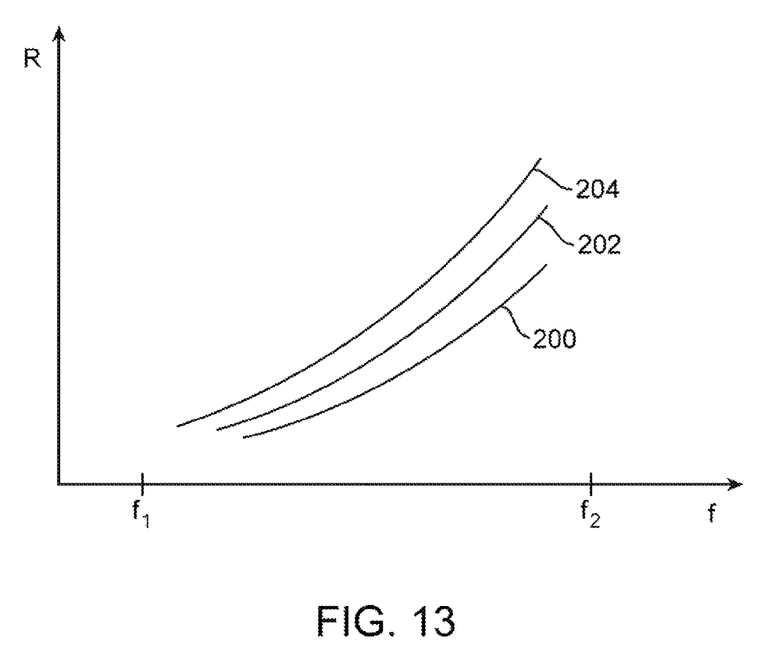
FIG. 13 is a graph in which resistance has been plotted as a function of operating frequency for inductors formed using different types of conductive paths in accordance with an embodiment of the present invention.

FIG. 13 is a graph of simulation results in which the resistance R of a conductive path for an inductor has been plotted as a function of operating signal frequency f for three different configurations of conductive path. Resistance R has been plotted over a range of frequencies between f1 and f2 (e.g., about 3 GHz to 50 GHz). Line 204 corresponds to the performance of a solid (rectangular) conductive path with no slots. Line 206 corresponds to the performance of a conductive path with longitudinal slots to help counteract the skin effect. As the FIG. 13 graph demonstrates, the inclusion of slots in the conductive path may help lower resistance R relative to the solid conductive path by mitigating some of the impact of the skin effect at high operating frequencies. Line 200 corresponds to a conductive path with intertwined conductors (e.g., three intertwined conductive lines). The intertwined nature of the conductive lines in the conductive path corresponding to line 200 helps reduce proximity effects and therefore reduces resistance R more than both the solid (line 204) and the slotted (line 202) configurations.

Figure 14:
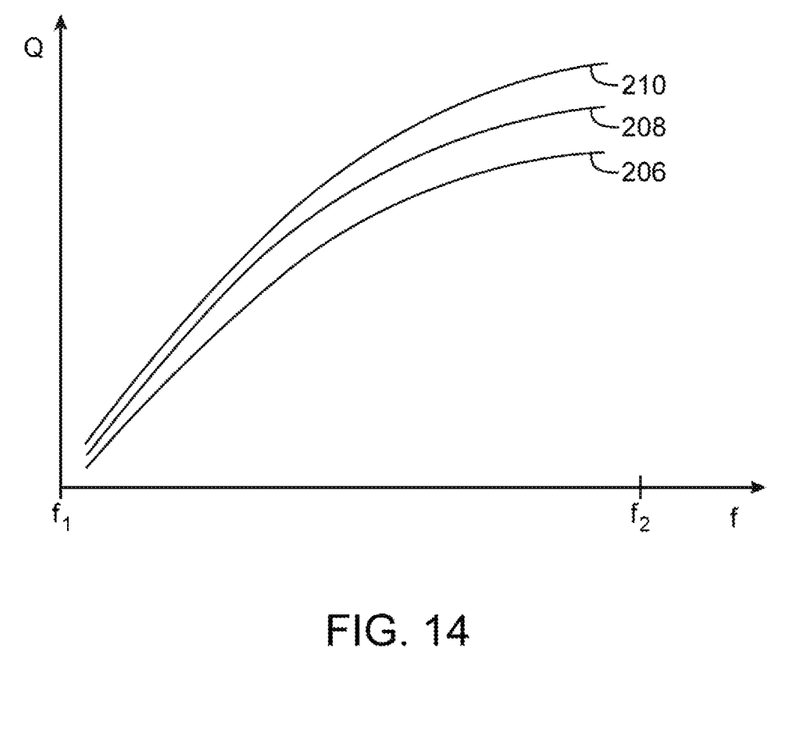
FIG. 14 is a graph in which inductor quality factor has been plotted as a function of operation frequency for different types of conductive paths in accordance with an embodiment of the present invention.

FIG. 14 is a graph of simulation results in which inductor quality factor Q has been plotted as a function of frequency for inductors formed from the three conductive paths associated with FIG. 13. Curve 206 is a plot of the quality factor Q for a solid trace. Curve 208 is a plot of the quality factor Q for a conductive path with longitudinal slots. Curve 210 is a plot of the quality factor Q for a conductive path with intertwined conductive lines. As the graph of FIG. 14 demonstrates, the magnitude of Q is lowest for the inductor formed from the solid conductor (line 206). The inductor formed from the slotted conductor (line 208) has better Q values than the solid conductor inductor. Line 210, which corresponds to the inductor formed from intertwined conductive lines, exhibits better Q values than both the solid conductor and slotted conductor inductors due to reductions in proximity effects.

Figure 15:
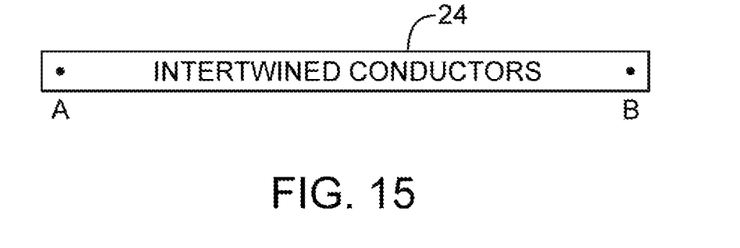
FIG. 15 is a top view of an illustrative linear inductor formed from a conductive path that has intertwined conductors in accordance with an embodiment of the present invention.
Figure 16:
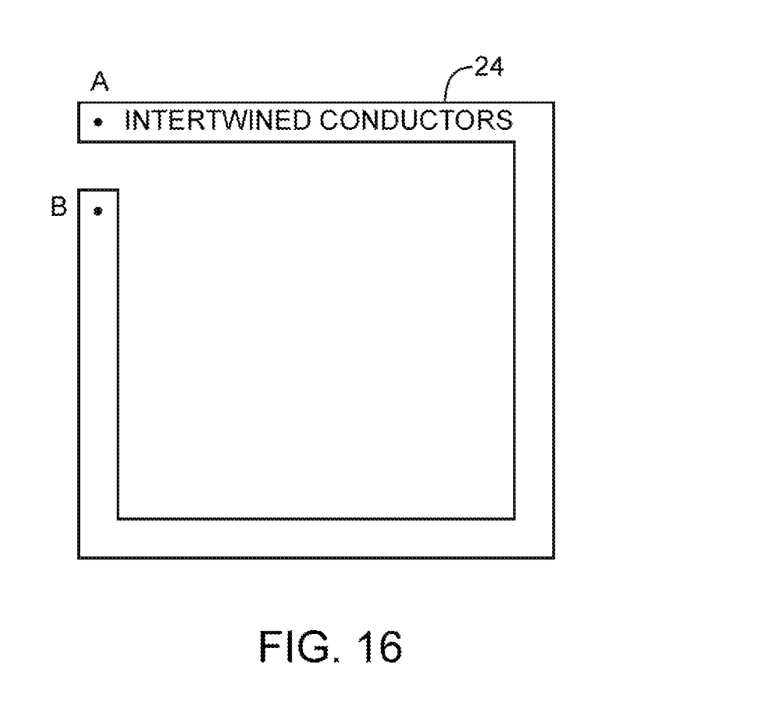
FIG. 16 is a top view of an illustrative loop-shaped inductor formed from a conductive path that has intertwined conductors in accordance with an embodiment of the present invention.

Inductors formed from conductive paths 24 with intertwined conductive lines can be formed in any suitable shape. FIG. 15 is a top view of an illustrative linear inductor in which conductive path 24 is formed in a straight line between inductor terminal A and inductor terminal B. FIG. 16 is a top view of an illustrative spiral (loop-shaped) inductor in which conductive path 24 has a loop shape. The illustrative inductor of FIG. 16 has a single loop, but spiral inductor shapes with multiple loops may be used if desired. The intertwined conductive lines in conductive paths 24 of FIGS. 15 and 16 may include segments with two intertwined conductive lines, three intertwined conductive lines, or more than three intertwined conductive lines. Portions of the inductors may also use conductive paths of other configurations (e.g., solid lines, slotted lines, etc.). Loop-shaped conductive paths of the type shown in FIG. 16 may have rectangular loops, circular loops, octagonal loops, or loops with other combinations of curved and straight segments.

The foregoing is merely illustrative of the principles of this invention and various modifications can be made by those skilled in the art without departing from the scope and spirit of the invention.

What is claimed is:

1. An inductor, comprising: a first terminal; a second terminal; and a conductive path coupled between the first and second terminals, wherein the conductive path includes a plurality of intertwined conductive lines in an integrated circuit, wherein each of the intertwined conductive lines extends for at least a distance in a direction that is parallel to a linear path between the first and second terminals, wherein one of the plurality of intertwined conductive lines crosses over the remaining conductive lines in a first crossover region in the conductive path, and wherein another one of the plurality of intertwined conductive lines crosses under the remaining conductive lines in a second crossover region in the conductive path.

2. The inductor defined in claim 1 wherein the plurality of intertwined conductive lines includes at least a first conductive line formed from at least one metal layer in the integrated circuit and at least a second conductive line formed from the at least one metal layer in the integrated circuit.

3. The inductor defined in claim 2 wherein the plurality of intertwined conductive lines includes at least a third conductive line formed from the at least one metal layer in the integrated circuit.

4. The inductor defined in claim 1 wherein the plurality of intertwined conductive lines includes at least first, second, and third conductive lines formed from metal layers in the integrated circuit.

5. The inductor defined in claim 1 wherein the plurality of intertwined conductive lines includes first portions that run parallel to each other, wherein the plurality of intertwined conductive lines includes second portions that cross over each other, and wherein a subset of the plurality of intertwined conductive lines cross over each other multiple times between the first terminal and the second terminal.

6. The inductor defined in claim 1 wherein the plurality of intertwined conductive lines comprises a plurality of segments in which the conductive lines run parallel to each other, and wherein a first line of the plurality of intertwined conductive lines crosses second and third lines of the plurality of intertwined conductive lines in the first crossover region.

7. The inductor defined in claim 6 wherein the plurality of intertwined conductive lines comprises metal layer structures and vias.

8. The inductor defined in claim 1 wherein the integrated circuit includes a dielectric stack including alternating metal layers and via layers and wherein the plurality of intertwined conductive lines includes at least some conductive structures formed in at least one of the via layers.

9. The inductor defined in claim 1 wherein the plurality of intertwined conductive lines includes a plurality of cross-over regions in which the conductive lines cross over each other.

10. The inductor defined in claim 1 wherein the conductive path is formed from metal layers and via layers in an integrated circuit, wherein the plurality of intertwined conductive lines are formed at least partly from metal traces in the metal layers, and wherein the conductive path includes a plurality of crossover regions between the first and second inductor terminals in which the plurality of intertwined conductive lines cross each other without electrically connecting to each other.

11. The inductor defined in claim 10 further comprising:
an input-output pad formed in a pad layer; and
a via in a given one of the via layers that electrically couples the input-output pad to the metal layers.

12. The inductor defined in claim 1 wherein the linear line is parallel to a first edge of a rectangular region, wherein the first edge of the rectangular region has a length that extends between the first and second terminals, wherein the rectangular region has a second edge that is perpendicular to the first edge of the rectangular region, and wherein each of the plurality of intertwined conductive lines is disposed within the rectangular region.

13. The inductor defined in claim 1 wherein none of the plurality of intertwined conductive lines forms a loop between the first and second terminals.

14. An inductor, comprising: a first terminal; a second terminal; a conductive path formed of intertwined conductive lines, wherein the intertwined conductive lines include at least first, second, and third lines formed in at least first and second metal layers, wherein the conductive path includes segments where the first, second, and third lines run parallel to one another and includes crossover regions, wherein the first line crosses over the second and third lines in a first crossover region of the crossover regions, wherein the third line crosses under the first and second lines in a second crossover region of the crossover regions, wherein the conductive lines comprise conductive material, and wherein at least a majority of the conductive material of the intertwined conductive lines is located between the first and second terminals; at least one input-output pad formed in a pad layer; and a via that electrically couples the input-output pad to the first metal layer.

15. The inductor defined in claim 14, wherein the first, second, and third lines cross each other without electrically connecting to each other in the crossover regions.

16. The inductor defined in claim 14 wherein the intertwined conductive lines include vias and conductive crossover line segments in the crossover regions.

17. An inductor, comprising:
a first inductor terminal;
a second inductor terminal; and a conductive path that extends between the first and second inductor terminals, wherein the conductive path includes at least first, second, and third intertwined conductive lines, wherein the conductive path is formed from metal layers and via layers in a dielectric stack of an integrated circuit, wherein the first, second, and third intertwined conductive lines are formed at least partly from metal traces in the metal layers, wherein the conductive path includes a plurality of crossover regions between the first and second inductor terminals in which the first, second, and third intertwined conductive lines cross each other without electrically connecting to each other, wherein a first one of the intertwined conductive lines crosses over the remaining conductive lines in a first crossover region, wherein a second one of the intertwined conductive lines crosses under the remaining conductive lines in a second crossover region, wherein the conductive lines comprise conductive material, and wherein substantially all of the conductive material of the intertwined conductive lines is located between the first and second inductor terminals.

18. The inductor defined in claim 17 wherein the three metal layers comprise first, second, and third metal layers, wherein the first intertwined conductive line includes a first portion formed in the first metal layer and a second portion formed in the second metal layer, and wherein the second portion has gaps corresponding to the cross-over regions between the first and second inductor terminals.

19. A method, comprising:
providing a first inductor terminal in an integrated circuit;
providing a second inductor terminal in an integrated circuit; and
providing a conductive path in the integrated circuit that extends between the first and second inductor terminals, wherein the conductive path includes at least first, second, and third intertwined conductive lines and wherein each of the intertwined conductive lines is distributed along a linear path that extends between the first and second inductor terminals, wherein the intertwined conductive lines form at least first and second crossover regions, wherein the first conductive line crosses over the second and third conductive lines in the first crossover region, and wherein the second conductive line crosses under the first and third conductive lines in the second crossover region.

20. The method defined in claim 19 wherein providing the conductive path comprises forming the conductive path from metal layers and via layers in the integrated circuit, the method further comprising:
forming the first, second, and third intertwined conductive lines at least partly from metal traces in the metal layers.

21. The method defined in claim 20 wherein providing the conductive path comprises forming a plurality of crossover regions in the conductive path between the first and second inductor terminals in which the first, second, and third intertwined conductive lines cross each other without electrically connecting to each other.

22. The method defined in claim 20 wherein providing the conductive path comprises forming the conductive path at least partly from vias in the via layers.

23. The method defined in claim 19, wherein a first routing pattern of the at least first, second, and third intertwined conductive lines in the second crossover region is different from a second routing pattern of the at least first, second, and third intertwined conductive lines in the second crossover region.

\* \* \* \* \*